United States Patent [19]

Ohji et al.

[11] 4,315,960

[45] Feb. 16, 1982

[54] METHOD OF MAKING A THIN FILM

[75] Inventors: Kenzo Ohji, Hirakata; Osamu Yamazaki, Suita; Kiyotaka Wasa, Nara; Shigeru Hayakawa, Hirakata, all of Japan

[73] Assignee: Matsushita Electric Industrial Co., Ltd., Japan

[21] Appl. No.: 154,080

[22] Filed: May 28, 1980

[51] Int. Cl.³ ................... C23C 13/00; C23C 15/00
[52] U.S. Cl. ..................... 427/248.1; 204/192 R; 204/298
[58] Field of Search ............. 204/192 R, 192 C, 298; 427/248.1; 118/720, 721, 624, 301, 504

[56] References Cited
U.S. PATENT DOCUMENTS 3,904,503  9/1975  Hanfmann .................. 204/192

FOREIGN PATENT DOCUMENTS 53-33531  9/1978  Japan ........................... 204/192

Primary Examiner—Aaron Weisstuch
Attorney, Agent, or Firm—Wenderoth, Lind & Ponack

[57] ABSTRACT

A method of making a thin film by vapor depositing a source material onto a substrate, in which a mask plate is provided between the source material and the substrate at a location such that $d<5l$ in which d denotes the distance between the mask plate and the substrate and $l$ denotes the mean free path of the evaporated particles, or $s<l$ in which s denotes the distance between the mask plate and the source material. The mask plate moves relative to the substrate and/or the source material during the deposition. Configuration of the mask plate is designed so as to equalize deposition rates through the above-mentioned movement.

6 Claims, 15 Drawing Figures

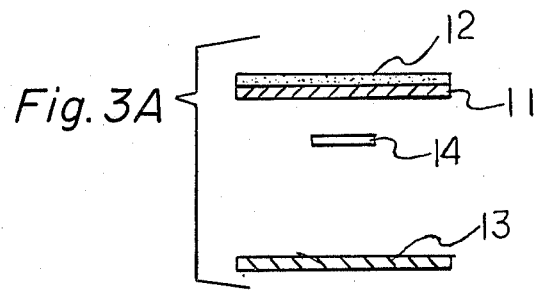
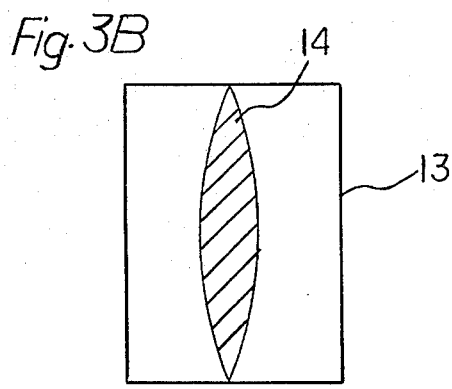
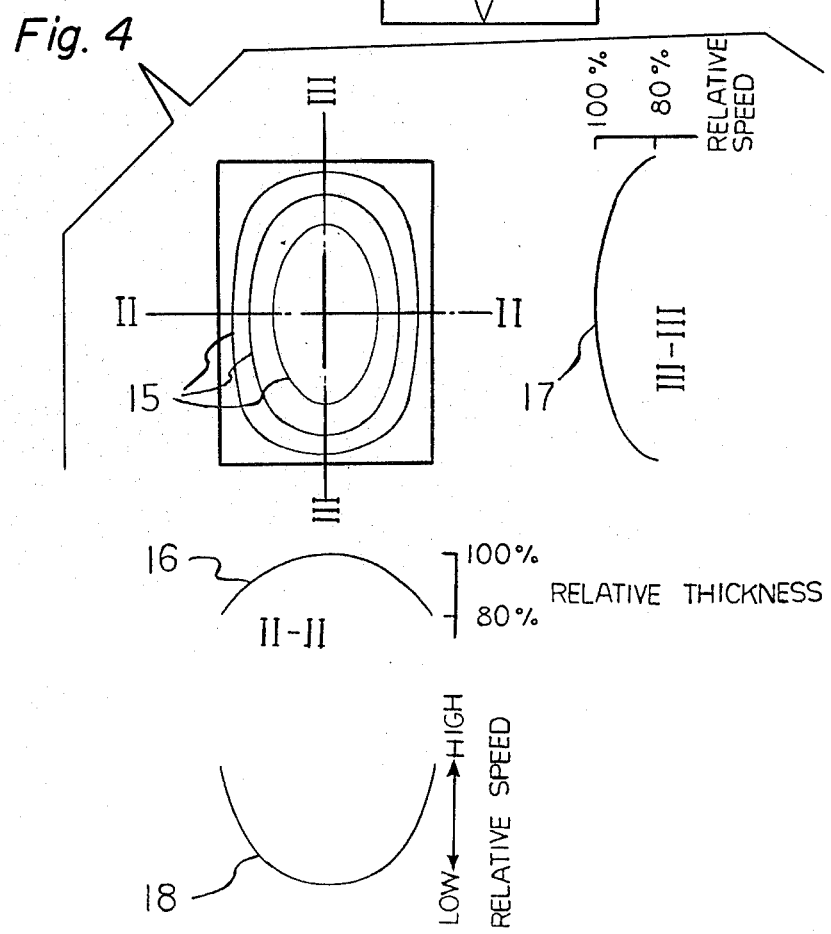

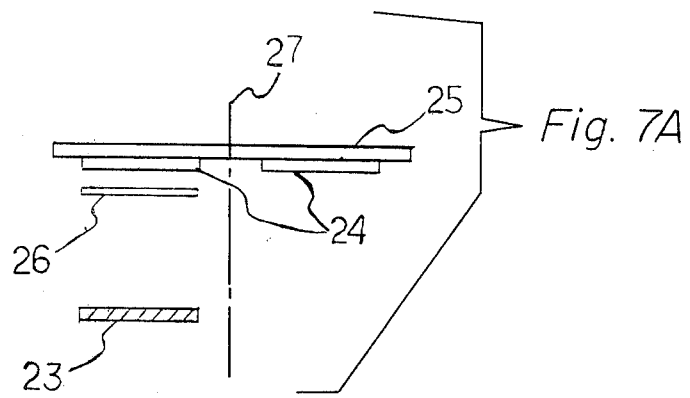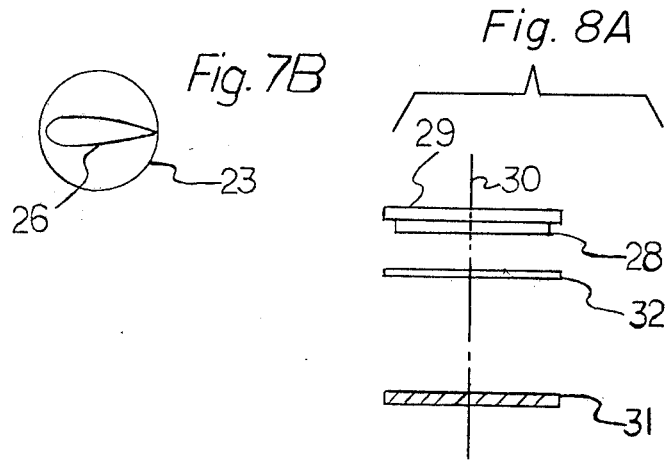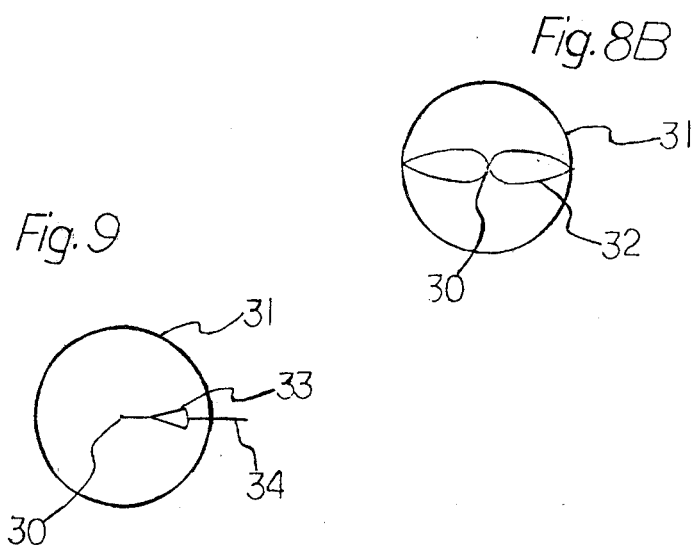

ically relates to an
improved method of making a thin film with uniform
thickness by using an evaporation step which is highly
practical for mass production of thin film components
and devices.

METHOD OF MAKING A THIN FILM

BACKGROUND OF THE INVENTION

This invention relates to a method of making a thin film by evaporation, and more particularly relates to an improved method of making a thin film with uniform thickness by using an evaporation step which is highly practical for mass production of thin film components and devices.

Thin films are used widely for constructing electronic solid state components and devices and the thickness uniformity of such films is an important requirement in mass production. As methods of making thin films, vacuum evaporation, sputtering and vapor phase reaction processes are well known. Such methods, however, have not been capable of providing thin films of satisfactorily uniform thickness.

FIG. 1 is a schematic illustration of a typical conventional vacuum deposition apparatus. In a vacuum chamber 1, a disk of source material 2 and a substrate 3 supported by a holder 4 are placed opposite to each other. Reference numeral 5 represents a deposited thin film. The deposited film 5 exhibits the thickness distribution as shown in FIGS. 2A and 2B. FIG. 2A illustrates a plan view of the film 5 in which contour lines 6 of the thickness are given and FIG. 2B is a graph illustrating the thickness distribution along line I—I of FIG. 2A. As seen from these figures, the thickness decreases from the center of the disc to the periphery. Such non-uniformity of the deposited film is due to the geometric arrangement of the source material 2 and the substrate 3 and is about ±10%.

There has been developed a method of compensating for the variation of film thickness dependent upon the location on the substrate, in which a moving mask plate partially interrupts the evaporated source material from depositing onto the substrate, i.e., the interruption rate is varied according to the location on the substrate so as to equalize the deposition rate.

The above method is quite effective, but further improvement has been required for practical use in mass production.

SUMMARY OF THE INVENTION

Therefore, it is an object of the present invention to provide an improved method of making thin films with uniform thickness by evaporating a source material.

Another object of the present invention is to provide an improved method of making thin films with uniform thickness on a mass production scale with high reproducibility.

These objects are achieved by a method wherein a mask plate for equalizing the deposition rate is provided between the source material and the substrate such that the mask plate and/or the substrate and/or the source material move relatively to each other; and the mask plate is so located that the mean free path l of evaporated particles and the space d between the mask plate and the substrate are in the relation d<5l, or l and the space s between the mask plate and the source material are in the relation s<l.

BRIEF DESCRIPTION OF THE DRAWINGS

FIG. 3A is a schematic sectional view of a deposition system according to the present invention;

FIG. 3B is a plan view of FIG. 3A;

FIG. 4 is a schematic plan view of a substrate covered with a thin film, in which there are also illustrated graphs showing the film thickness distributions and the speed of a movable mask plate relative to the substrate;

FIGS. 7A and 8A are a schematic sectional view of other deposition systems according to the invention;

FIGS. 7B and 8B are plan views of a part of FIGS. 7A and 8B, respectively; and

FIG. 9 is a plan view of another embodiment of a mask plate and a source material.

DETAILED DESCRIPTION OF THE INVENTION

Figure 1:
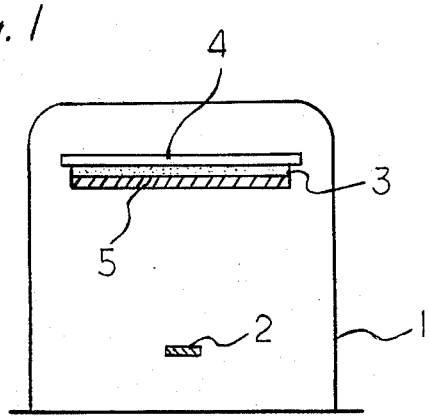
FIG. 1 is a schematic cross sectional view of a typical conventional vacuum deposition apparatus.
Figure 2A:
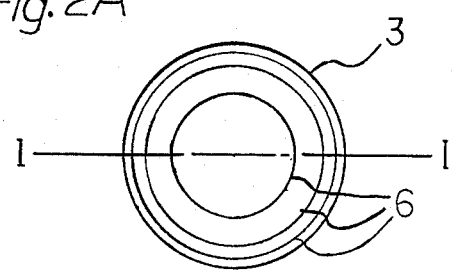
FIG. 2A is a plan view of a thin film obtained by the apparatus of FIG. 1.
Figure 2B:
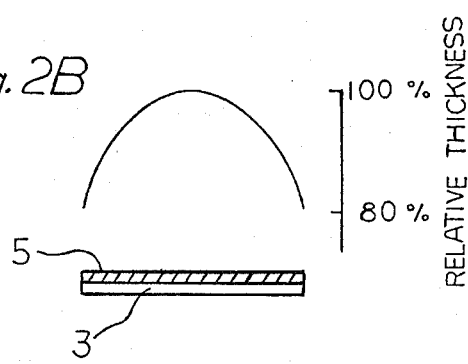
FIG. 2B is a graph illustrating the relative thickness distribution along line I—I of FIG. 2A.

Referring to FIGS. 3A and 3B, a substrate 11 is supported on a holder 12 which also serves as an anode plate in the case where sputtering is carried out. A source material 13 is placed facing the substrate 11, which functions as a cathode target if sputtering is carried out. A mask plate 14 is located between the source material 13 and the substrate 11. As shown in FIG. 3B, the mask plate 14 has a ellipse-like shape whose longer axis is parallel to a edge of the source material 13 and it reciprocates in the direction perpendicular to its longer axis.

In a conventional planar diode sputtering arrangement without the mask plate 14, the obtained film has large thickness distributions as shown in FIG. 4. Referring to FIG. 4, a numeral 15 represents contour lines of the film thickness, and 16 and 17 are graphs showing relative film thickness along lines II—II and III—III, respectively.

The width of the mask plate 14 in the direction parallel to its shorter axis varies according to the thickness distribution of deposited film represented by relative thickness line 17 in FIG. 4. That is to say, the width is large near the center areas of the substrate 11 where the film deposited without the mask plate 14 has a large thickness, and the width is small in the peripheral portion where the deposited film has small thickness. Thus when the mask plate 14 reciprocates in the direction perpendicular to its longer axis, the period of time when the substrate 11 is covered by the mask plate 14 is longer at the central portion of the substrate 11 than at the peripheral portion. This compensates the variation, in the direction of the line III—III in FIG. 4, of the depositing rate of source material 13 onto the substrate 11.

To compensate the variation of the depositing rate in the direction of the line II—II in FIG. 4, the mask plate 14 reciprocates at a variable speed. Its reciprocating speed changes according to the thickness distribution of the deposited film in the direction of the line II—II, which is represented by the graph 16. That is to say, the mask plate 14 moves faster at the peripheral portion of the substrate 11 than the center portion, as illustrated by graph 18 in FIG. 4. Thus the period of time when the substrate 11 is covered by the mask plate 14 is longer at the center portion than at the peripheral portion.

Two types of arrangement of the spacing between the mask plate 14 and the source material or the substrate 11 are possible.

In one mode the mask plate 14 is located near the substrate 11. The spacing between the mask plate 14 and the source material 13 is large enough not to disturb the evaporation of the source material 13. The distance d between the substrate 11 and the mask plate 14 is preferably shorter than $5 \times l$, where l denotes the mean free path of the evaporated particles. In a high vacuum ($<10^{-4}$ Torr) deposition system, in which $l<10$ cm, it is assumed that evaporated particles travel in straight lines within the distance l without any collision. Therefore when $d<l$, the thickness distribution is most remarkably effected by the mask plate movement.

The mask plate satisfactorily improves the distribution of the film thickness on the substrate, even if $d>l$. For example, in a low vacuum (from $10^{-1}$ to $10^{-2}$ Torr) deposition system wherein l is from 0.5 to 20 mm, such as cathodic sputtering, the mask plate has a large effect on the thickness distribution. The resultant film has uniform thickness with variation within $\pm 1\%$.

In cases where $d>5l$, it was not possible to decrease the thickness variation within $\pm 1\%$.

The most preferred distance d was found to be 5 to 20 mm for both high and low vacuum deposition processes. Below 5 mm, it is very difficult to position the mask plate precisely and above 20 mm the effect of the mask plate cannot be notably obtained. The other type of spacing arrangement positions the mask plate 14 near the source material 13. The distance s between the mask plate and the source material is preferably within l. In such an arrangement the mask plate acts as a shield plate on the source material and therefore the sputtering area of the target is controlled so as to compensate for the non-uniformity of sputtering rate.

The same result as described above can be obtained by reciprocating the substrate 11 instead of moving the mask plate 14.

In a conventional in-line type sputtering arrangement, in which the substrate passes pass over the target during sputtering the dynamic facing condition between the substrate and the source material is equalized in the direction of the substrate movement. Therefore the variation of sputtering rate does not occur in such direction, and the mask plate according to the invention is fixed above the source material.

Figure 5A:
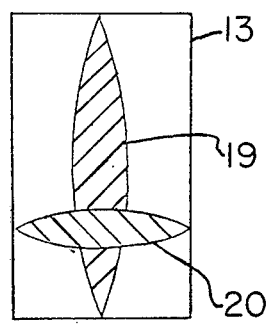
FIGS. 5A, 5B, 6A and 6B are schematic plan views of a mask plate and a source material of another embodiment of the present invention.
Figure 5B:
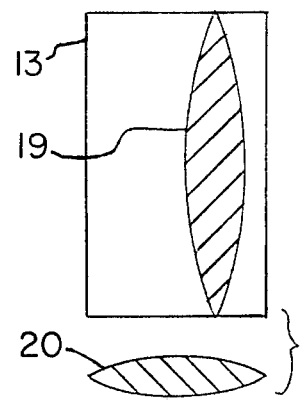

The above-mentioned variation of sputtering rate in the direction of the movement of the mask plate relative to the substrate may be compensated by the method illustrated in FIGS. 5A and 5B. In this method two elliptic-slaped mask plates 19 and 20 are provided. The longer axis of the mask plate 19 is perpendicular to that of the mask plate 20. The mask plates 19 and 20 reciprocate in the direction of the longer axis of each other at constant speed. The configurations of the mask plates are determined in a manner similar to that of the mask plate 14 in FIG. 3. Each of FIGS. 5A and 5B shows different states of the mask locations during reciprocation.

Figure 6A:
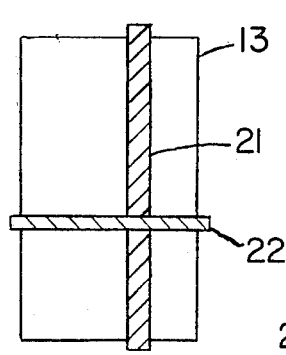
Figure 6B:
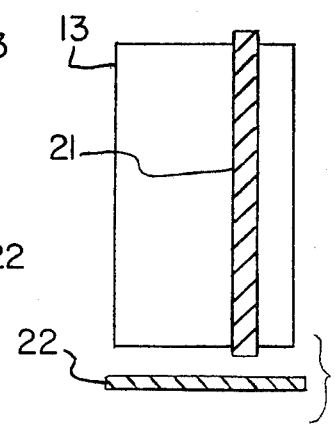

As shown in FIGS. 6A and 6B the masking may be performed by two rectangular mask plates 21 and 22. The longer axes of these mask plates 21 and 22 are perpendicular to each other and parallel to the edges of the source material 13. They reciprocate in the direction perpendicular to their longer axes at variable speed. The reciprocating speed is determined in the same manner as the reciprocating speed of the mask plate 14 in FIG. 3, so as to compensate the sputtering rate in the direction of the reciprocation.

In the above-mentioned arrangement illustrated in FIGS. 5 and 6, the reciprocation of the two mask plates may be performed separately, that is, one mask plate is kept out of line of the target when another mask plate moves.

If a pair of mask plates has the same period of reciprocation and moves simultaneously, the resultant thin film has a large thickness distribution. The reason is that the same areas of the substrate is very often covered with both mask plates during their reciprocation and so the deposited film is thinner at such areas than at the areas of the substrate. The simultaneous reciprocation of the above two mask plates can improve the distribution of film thickness within $\pm 1\%$, if the period of the reciprocation of one mask plate is not less than three times as long as that of the other mask plate.

Further examples of the mask plate arrangement are described hereinafter.

In FIGS. 7A and 7B, there is shown an application of this invention to a planer diode sputtering system with a disc target 23. The target 23 faces substrates 24 supported by a holder 25. A mask plate 26 is placed between the target 23 and the substrate 24, and has an elliptic-like form. The substrates 24 rotate around center axis 27. The longer axis of the mask plate 26 is located in the radial direction from the center axis 27.

In the example of FIGS. 8A and 8B, a substrate 28 placed on holder 29 rotates around its center axis 30. A disk target 31 faces the substrate 28, with its center positioned along the center axis 30. Mask plate 32 has a shape having a reduced width at a center portion. The film thickness uniformity is further improved by rotating the mask plate 32 in addition to the rotation of the substrate 28, around the center axis 30 in the opposite direction to the substrate rotation. It also improves the film thickness uniformity to rotate the target 31 around the axis 30.

FIG. 9 shows another example of the mask plate in the arrangement of FIG. 8. Mask plate 33 has fan-like shape, with an axis 34 located in the radial direction of the disc target 31. The mask plate 33 reciprocates between the center 30 and the periphery of the target 31 and rotates around the axis 30 during sputtering. The relative reciprocation speed of the mask plate 33 to the target 31 is altered so as to equalize the deposition rate. Further improvement can be expected by rotating the substrate and/or the target.

In the method of the present invention, cathodic sputtering is very useful for the evaporation of the source material. Rf-sputtering is convenient since various materials can be evaporated. D.C.-sputtering is convenient for evaporating metallic material, since the power supply is simple and the operation is easy. Magnetron-type cathodic sputtering is very useful for making thin films on a mass production scale since the deposition rates are very high. Planar magnetron sputtering is especially convenient since the arrangement of the substrates and target is simple. If the method according to the invention is not used, thin films obtained by using magnetron sputtering show a larger thickness variation than that obtained by using an ordinary diode sputtering. Therefore, the method of the present invention is quite preferable for a magnetron sputtering step.

The mask plate is composed of a thin metal, such as stainless steel, copper, chromium metallized spring steel, and chromium metallized bronze, which are formed to a suitable elliptic, rectangular, or fan-like shape with ease. Furthermore very little degassing of such metals occurs in the vacuum chamber. Such metals are very conductive and are placed parallel to the target plane, so that they have the same potential as the plasma in the sputtering atmosphere and thus do not disturb the plasma. The evaporation rate of the target does not vary with and without said mask plate, so that the improvement of the thickness distribution can be achieved without any bad effects.

A material having high electric resistance is preferable for holding said mask plate. Further, the material supporting the mask plate preferably has high thermal conductance, because the mask plate is exposed to heat radiated from the source material and is possibly deformed in a long sputtering run or repeated runs, causing unexpected thickness distributions. Such requirement is satisfied by materials such as beryllium oxide, aluminum oxide, and diamond.

Furthermore, in a long sputtering run or repeated runs, the mask plate is often subjected to deformation due to stress induced by a layer of sputtered particles' deposited on the mask plate. In order to reduce such deformation, the mask plate should be comprised of a material which has a similar thermal expansion coefficient to that of the deposited material. The difference in thermal expansion coefficient between the mask plate and deposited material should be less than $10^{-5}/°$ C. If the difference is larger than this value, the mask plate is deformed when the layer deposited on it becomes 20 to 30 $\mu$m thick.

Further, in order to reduce the deformation of the mask plate during the sputtering step, the mask plate is preferably covered or coated with a fluorine containing polymer. Because such polymers do not permit adhesion of any sputtered particles it permits high temperature operation at as much as 200° C. during a sputtering run.

What is claimed is:

1. A method of making a thin film comprising the step of vapor depositing a source material onto a substrate with an apparatus having first and second mask plates for equalizing the deposition rate, located between said source material and said substrate, said mask plates and said substrate being moved relatively to each other, wherein said substrate and said source material are stationary and said mask plates reciprocate, the deposition rate being equalized in two directions perpendicular to each other by a combination of a variation of the width contour of said mask plates, the variation of the speed of said reciprocation and the first mask plate reciprocating in the direction perpendicular to the reciprocating direction of the second mask plate.

2. The method as claimed in claim 1, wherein said mask plates have a width contour such that the mask plates mask evaporated particles of said source material at non-uniform masking rates in the direction of the longer axis of the mask plate so as to equalize deposition rates in that direction, and the speed of said reciprocation varies so that the deposition rate varies in the direction of reciprocation so as to equalize deposition rates in the last mentioned direction.

3. The method as claimed in claim 1, wherein said second mask plate has an elliptic form, whose longer axis is perpendicular to the longer axis of said first mask plate, said mask plates reciprocating at constant speed.

4. A method as claimed in claim 1, wherein said source material is in a rectangular form, and said mask plates are rectangular mask plates whose longer axes are perpendicular to each other and located in parallel to the edges of said source material, and which reciprocate perpendicularly to the longer axes of themselves at varying speeds so that the masking rates for evaporated particles of said source material varies in the directions of the respective reciprocations to equalize the deposition rates in such directions.

5. A method as claimed in claim 3 or 4, wherein said two mask plates move alternately, so that one of said two mask plates is kept out of the path of said evaporated source particles when the other is in motion.

6. A method as claimed in claim 3 or 4 wherein said two mask plates reciprocate independently, and the period of reciprocation of one mask plate is not less than three times as long as that of the other.

* * * * *